United States Patent [19]

Leatham

[11] Patent Number: 4,769,525
[45] Date of Patent: Sep. 6, 1988

[54] CIRCUIT PACKAGE ATTACHMENT APPARATUS AND METHOD

[75] Inventor: James G. Leatham, Redondo Beach, Calif.

[73] Assignee: Hughes Aircraft Company, Los Angeles, Calif.

[21] Appl. No.: 902,376

[22] Filed: Sep. 2, 1986

[51] Int. Cl.$^4$ .............................................. H05B 3/36
[52] U.S. Cl. ................................... 219/209; 228/123
[58] Field of Search .................... 219/209, 210, 85 M, 219/535; 228/123; 156/321, 306.6; 357/28

[56] References Cited

U.S. PATENT DOCUMENTS

| | | | |
|---|---|---|---|
| 1,818,485 | 8/1931 | Lambert | 219/243 |
| 2,061,461 | 11/1936 | Gouhin | 219/243 |
| 3,289,046 | 11/1966 | Carr | 219/209 |
| 3,660,632 | 5/1972 | Leinkram | 228/240 |
| 4,096,008 | 6/1978 | Taylor | 156/321 |
| 4,176,274 | 11/1979 | Lipperd | 219/535 |
| 4,362,684 | 12/1982 | Thalmann | 219/535 |
| 4,374,316 | 2/1983 | Inamori | 219/209 |
| 4,436,988 | 3/1984 | Blumenkranz | 219/535 |
| 4,529,836 | 7/1985 | Powers | 228/123 |
| 4,650,107 | 3/1987 | Keser | 228/123 |

FOREIGN PATENT DOCUMENTS

| | | | |
|---|---|---|---|
| 55-130134 | 10/1980 | Japan | 156/306.6 |
| 60-106662 | 6/1985 | Japan | 228/123 |
| 558391 | 1/1944 | United Kingdom | 338/280 |

OTHER PUBLICATIONS

Ecker, M. E., "Separable Multilevel . . . ", IBM Tech. Disc. Bull., vol. 20, No. 11B, Apr. 1978, pp. 4776–4779.
Palfi, T. L. and T. S. Slater, "Selective Electrical . . . ", IBM Tech. Disc. Bull., vol. 9, No. 11, Apr. 1967, p. 1668.

Primary Examiner—E. A. Goldberg
Assistant Examiner—Teresa J. Walberg
Attorney, Agent, or Firm—Leonard A. Alkov; A. W. Karambelas

[57] ABSTRACT

A circuit package, or other device, (10) is mounted on a printed circuit board, or other substrate, (14) with an electrically conductive sinuous resistor wire structure 30 therebetween to define a space filled with adhesive. When the adhesive is set the package is held in place. When removal is desired, current is passed through the sinuous wire structure to soften the adhesive to permit removal of the package without damage to the package or the board.

19 Claims, 2 Drawing Sheets

CIRCUIT PACKAGE ATTACHMENT APPARATUS AND METHOD

BACKGROUND OF THE INVENTION

This invention is directed to the manner in which a device is attached to a surface, and particularly the manner in which a circuit package is attached to a cold plate or to a circuit board, together with the facility to remove the package from the surface upon which it is mounted.

In modern electronics, integrated circuitry is formed on semiconductor chips, each of which is in turn mounted within a package for protection, connection, mounting and cooling. In some cases, a liquid adhesive is used for mounting the packages upon a base. This type of mounting relies on capillary action to cause the adhesive to run in the opening between the package and the support base on which it is mounted. This often results in non-uniform bonds and occasionally very large voids are present because of uneven flow. The attachment is not only to secure the package in place on its base, but also to conductively remove heat from the package into the base. Voids in the adhesive attachment thus reduce heat outflow from the package into the supporting base and result in inadequate cooling. In another manner of attachment, filled adhesives are placed on the base like blobs of putty, and the package is pressed into the adhesive. These materials are often avoided because of the difficulty in achieving uniformity of adhesive thickness. A uniform thickness is necessary for predictable heat flow out of the package.

When attached by either of these attachment methods, it is extremely difficult to remove a defective package. In some cases, nevertheless, repairs can be effected by removing a defective package for repair or replacement thereof. An adhesive such as silver-filled epoxy has such a high adhesion that packages are practically impossible to remove for rework without destroying the package, the printed wiring board which serves as its base, or both.

Past efforts to facilitate the removal of defective packages have concentrated on reducing the the adhesive attachment area of the bond. Such efforts necessarily reduce the heat transfer from the package to the base. In most cases, the base will be a printed circuit board carrying a plurality of packages, and thus the removal of one package so that it may be repaired and replaced or a new package substituted therefor is very helpful in containing costs. When replacement is possible, the remainder of the structure including the printed circuit board and other packages thereon may continue to be used.

SUMMARY OF THE INVENTION

In order to aid in the understanding of this invention, it can be stated in essentially summary form that it is directed to a circuit package attachment apparatus and method wherein an electrical conductor of substantially uniform thickness is sinuously configured and placed between the package and its base or support so that the conductor serves as a spacer to space the package uniformly away from the base to provide for a uniform adhesive thickness and for locally heating the adhesive for detachment of the package from the base.

It is, thus, a purpose and advantage of this invention to provide a sinuously configured conductor which serves the several purposes of providing a spacer between the package and its base so that uniform thickness adhesive attachment of the package to the base is achieved, together with the conductor serving to provide uniform adhesive flow to minimize adhesive voids and wherein the conductor can be heated to heat locally the adhesive to a sufficient degree to permit the demounting of the package from its support base without destruction of the package or base.

Other purposes and advantages of this invention will become apparent from a study of the following portion of the specification, the claims and the attached drawings.

DESCRIPTION OF THE PREFERRED EMBODIMENT

Figure 1:
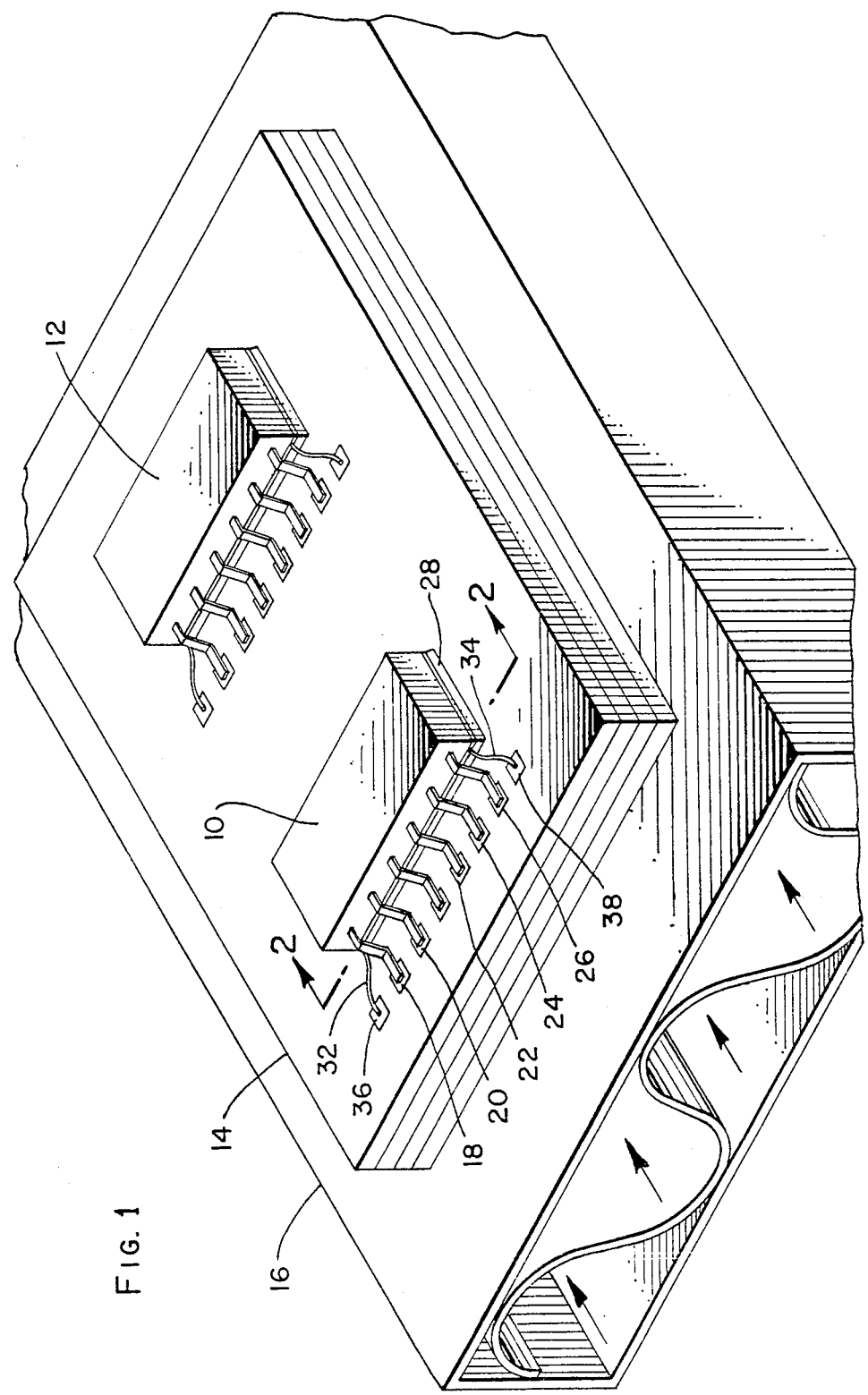
FIG. 1 is an isometric view of two circuit packages secured by the attachment apparatus and method of this invention to a printed circuit board which is mounted on a cooling duct, with parts broken away.
Figure 2:
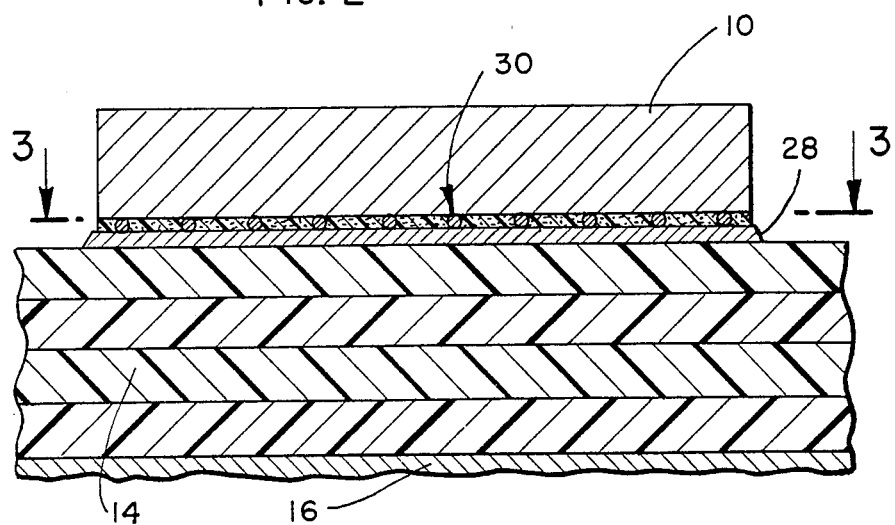
FIG. 2 is an enlarged section taken generally along line 2—2 of FIG. 1, with parts broken away.

In FIG. 1, circuit packages 10 and 12 are shown as mounted upon a base, which in the preferred embodiment is a printed circuit board 14. In FIGS. 1 and 2, the printed circuit board is illustrated as being a multiple layer printed circuit board. The purpose of the printed circuit board is to supply signals and power to the circuit packages 10 and 12, and perhaps other similar packages mounted upon the printed circuit board and to take the signals therefrom. The circuit board also serves as a base for support of the circuit packages and as a means for extracting heat from the circuit packages. To aid in the heat extraction, the printed circuit board 14 is cooled by having it mounted upon cooling duct 16. In the present case, a duct through which air is circulated is illustrated as the means for extracting heat from the printed circuit board. Other cooling devices could alternatively be used. Such alternative cooling devices are cold plates with liquid circulating therein or cold plates connected to another structure by which heat can be rejected from the cold plate. The illustration of a cooling duct is to point out the need for optimum thermal conductivity from each circuit package to the printed circuit board, in order to cool the printed circuit package The printed circuit board 14 has the functions of supporting the circuit package 10, forming a heat transfer path from the circuit packages 10 and 12 to the cooling duct 16, and providing circuit paths and pads by which the circuit package can be electrically served. Merely as an illustration, a plurality of pads is shown on the top surface of the board 14 for electrical interconnection to supply power to, to supply signals to, and to take processed signals from the circuit package 10. Pads 18, 20, 22, 24 and 26 are illustrative of the several pads shown around the circuit package 10 in FIGS. 1 and 3. In the conventional flat pack, there are connections and pads on both sides of the package and occasionally on the ends. As seen in FIG. 1, there are similar pads around the circuit package 12 for connection thereto. The pads represent connections to printed circuitry on and in the board. The printed circuitry can be formed in any conventional way, such as depositing the desired circuitry and pads on the board or etching away from a conductor layer the undesired conductive areas to leave the desired circuitry and pads. The multiple layer board permits cross-over of conductors and thus can provide more intricate circuitry and proper pad arrangement. It is understood that the circuit packages 10 and 12 may include reactive circuit elements in addition to large-scale integrated circuitry.

The pads include solder pad 28 which is the same size and configuration as the circuit package 10. The solder pad 28 may be formed by the deposition of solder upon a printed circuit pad formed on the top surfaces of the printed circuit board. Wave soldering can build up such a pad with solder to a substantially uniform thickness, as indicated.

Figure 3:
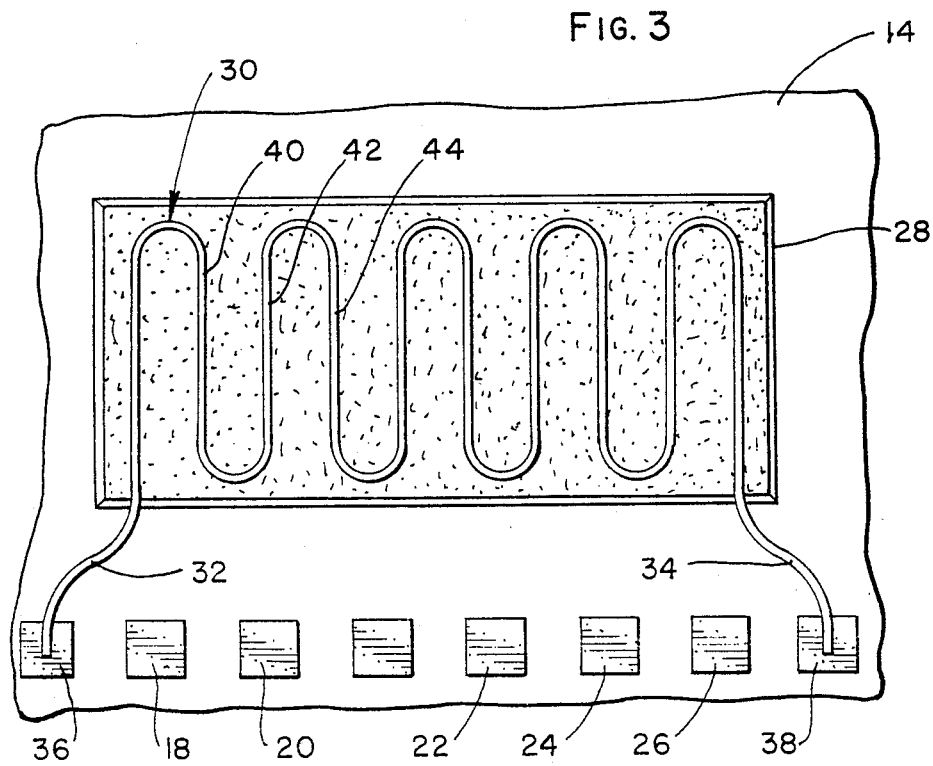
FIG.3 is a downwardly looking section taken generally along line 3—3 of FIG. 2, with parts broken away.

In accordance with this invention, an electrically conductive wire 30 of substantially uniform thickness is formed into a sinuous configuration such that both ends of the wire extend off of the pad 28 without the wire crossing over itself. The sinuous configuration illustrated in FIG. 3 is preferred. In this sinuous configuration, the ends 32 and 34 are brought off of the pad 28 and are bonded to pads 36 and 38 for purposes described below. A preferred wire is a resistive wire carrying an insulation thereon. As an example of a preferred embodiment, the wire has a size of 36 AWG and a composition of 74.5 percent nickel, 20 percent chromium, 2.75 percent aluminum, and 2.75 percent copper. It is coated with a 0.0005 inch thickness insulating coating of polyimide. The wire is available from Driver Harris Company under the trade name "Karma." The insulation is available from E. I. DuPont under the brand name "Pyre-M. L." The wire has a total diameter of about 0.006 inch.

The wire is wound into the sinuous configuration indicated in FIG. 3 with a spacing between the legs of the sinuous configuration of about 0.2 inch. A series of spaced legs 40, 42 and 44 are positioned substantially equidistant to each other and are joined together by curves at the ends of the legs. It is to be noted that there are no enclosed spaces between the lengths of the electrically conductive wire 30 in its sinuous configuration. Enough loops and legs are formed to substantially cover the pad 28 so that each point on the pad is substantially no more than 0.1 inch away from a point on the sinuous conductive wire configuration. Thereupon, an adhesive is placed evenly over the configuration of wire. The circuit package 10 is placed thereover, pressed down, and is held in place. The preferred adhesive is pasty, and when the package is pressed down, the adhesive spreads all over the package-pad interface. The sinuous conductive wire configuration acts as a spacer so that the package 10 is uniformly spaced from the pad 28. As indicated, the spacing is about 0.006 inch. With a precisely defined spacing, heat transfer from the package to the base is more uniformly achieved. In addition, the wire legs in the sinuous wire configuration act to help in the removal of air in the space by providing vent paths, so that a greater adhesive filling with less chance of voids exists in the adhesive on the pad 28. Thus, the sinuous wire configuration precisely defines spacing and aids in the expelling of air from the space. In the preferred embodiment, the adhesive is pasty. However, when a low viscosity adhesive is used, it can be drawn into the space by capillarity. The wire legs also help to expel air in this process.

The type of adhesive to be used depends on the question of whether or not it should be of electrically insulative character. The metal box of the circuit package 10 may be electrically isolated from the solder pad 28, or it may be electrically connected thereto. Solder is a good adhesive which provides good thermal conductivity and electrical conductivity. Eutectic tin-lead solder (tin 63 percent, lead 37 percent) is satisfactory. Also suitable as a pasty electrically conductive adhesive is silver-filled epoxy, which also has good thermal conductivity. For example, Eccobond 56C, 57C, and 58C are silver-filled epoxies supplied by W. R. Grace and Company, Canton, MA, and are satisfactory. In addition, Ablestik 131-1 from Ablestik Adhesive Co., Inc., Gardena, Calif. 90248 is a silver-filled epoxy which is also satisfactory.

When there is need for electrical isolation between the circuit package 10 and the solder pad 28, polysulfide adhesive filled with alumina or boron nitride or combination thereof provides good electrical resistivity and good thermal conductivity. For example, 80 parts by weight of a 2 to 1 mixture (by weight) of boron nitride and alumina is added to 110 parts by weight of Proseal 1321 polysulfide adhesive. Proseal is available from Essex Chemical Corp., Coast Pro Seal Div., Compton, Calif. These pasty adhesives are squeezed in the gap as the package is pressed into place. The parts are cured in the usual way or by sending current through the sinuous electrically conductive wire configuration 30 to effect a temperature cure. In this way, the circuit package is reliably attached to the printed circuit board and its pad, with good thermal conductivity and adequate mechanical attachment. The electrically conductive wire configuration 30 is now embedded in the adhesive layer.

When it is desired that one of the circuit packages be removed from the printed circuit board for repair of the system, such can be accomplished by delivering current through the conductive wire configuration 30. Enough current is sent through the wire to achieve a resistance-induced temperature exceeding the glass transition temperature for thermosetting plastics or exceeding a softening point for solder or other thermoplastic adhesives. Because of transient times and the distance of the semiconductor chip from the heat source, the sinuous wire configuration may be heated to a high temperature without greatly heating the semiconductor chip in the circuit package 10. Furthermore, the glass transition temperature for epoxy is a relatively cool 125° C. This temperature can be quickly reached without overheating the semiconductor chips. In an experimental configuration, 20 watts of input power to the sinuous electrically conductive wire structure for 20 seconds allowed the circuit package 10 to be lifted off when silver-filled epoxy such as "Eccobond 57C" was used as adhesive. The good thermal conductivity of the adhesive is helpful in delivering the heat to the adhesive to soften the adhesive for removal of the package.

The structure and energy input into the wire is related in such a manner that the 125° C. glass transition point of epoxy adhesive is reached over the entire adhesive area without the inside of the package reaching 300° C., the maximum temperature permitted at the transistors within the package. The factors include thermal conductivity and thickness of the package and adhesive, wire spacing and energy input.

The sinuous electrically conductive wire configuration illustrated in FIG. 3 is desirable, but the wire spacing does not appear to be critical if the adhesive is a good thermal conductor. The disclosed wire gage, material and adhesives work well, but the concept is not limited only to these materials and configurations. Different wire sizes and materials and different adhesives may be desirable for certain applications.

The invention has been described as an attachment and release apparatus and method particularly useful for the attachment and release of a circuit package on a circuit board. It is also useful in a wide variety of other mechanical attachment and release situations such as use as a control mechanism. In this example, two components may be held together by this package attachment, while outside forces would otherwise force the components apart. At some preset criteria, a current may be switched through the wire, whereupon the components will separate. An example of such a use would be in a coal mine. A solid-state velocity sensor can be made to switch current through the wire 30 at a preset velocity reading. In this case, the components will be used to hold a warning flag out of sight at the roof of the mine. Upon being activated, that, is upon current being sent through the wire 30, gravity or a spring will cause the flag to be dropped and suspended in plain view to warn miners not to enter the area. In this example, use is made of the relationship of a threshold roof velocity to the probability of a cave-in. This relation, while true, is one example, and the package atachment can be used as part of many other control systems with no exercise of the inventive faculty This invention has been described in its presently contemplated best mode, and it is clear that it is susceptible to numerous modifications, modes and embodiments within the ability of those skilled in the art and without the exercise of the inventive faculty. Accordingly, the scope of this invention is defined by the scope of the following claims.

What is claimed is:

1. A circuit package assembly comprising:
   a support base having a surface;
   a sinuous electrically conductive wire structure on said surface;
   a circuit package on said sinuous wire structure; and
   thermally conductive adhesive between said circuit package and said surface between said sinuous wire structure so that said sinuous wire structure acts as a spacer to define substantially uniform space between said circuit package and said support base and said thermally conductive adhesive is in said space so that a substantially uniform adhesive thickness is achieved and whereby electric current through said sinuous wire structure produces heat in said thermally conductive adhesive to act on said thermally conductive adhesive.

2. The assembly of claim 1 wherein said sinuous wire structure is made of a metal alloy containing nickel and chromium.

3. The assembly of claim 1 wherein said sinuous wire structure is insulated from said surface and said package by dielectric insulation on said wire.

4. The assembly of claim 3 wherein said sinuous wire structure is made of a metal alloy containing nickel and chromium.

5. A circuit package assembly comprising:
   a support base having a surface, said support base comprising a printed circuit board;
   a sinuous electrically conductive wire structure on said surface, said electrically conductive sinuous wire structure having first and second ends and said first and second ends of said sinuous wire structure are respectively attached to first and second pads on said printed circuit board and said first and second pads are connected to supply electric current to said sinuous wire structure;
   a circuit package on said sinuous wire structure; and
   thermally conductive adhesive between said circuit package and said surface between said sinuous wire structure so that said sinuous wire structure acts as a spacer to define substantially uniform space between said circuit package and said support base and said thermally conductive adhesive is in said space so that a substantially uniform adhesive thickness is achieved and whereby electric current through said sinuous wire structure produces heat in said thermally conductive adhesive to act on said thermally conductive adhesive.

6. The assembly of claim 5 wherein said sinuous wire structure is made of a metal alloy containing nickel and chromium.

7. The assembly of claim 5 wherein said sinuous wire structure is insulated from said surface and said package by dielectric insulation on said wire.

8. The assembly of claim 7 wherein said sinuous wire structure is made of a metal alloy containing nickel and chromium.

9. A circuit package assembly comprising:
   a support base having a surface;
   a sinuous electrically conductive wire structure on said surface; and
   thermally conductive adhesive selected from the group consisting of epoxy, silver-filled epoxy, alumina-filled polysulfide, boron nitride and alumina-filled polysulfide and solder between said circuit package and said surface between said sinuous wire structure so that said sinuous wire structure acts as a spacer to define substantially uniform space between said circuit package and said support base and said thermally conductive adhesive is in said space so that a substantially uniform adhesive thickness is achieved and whereby electric current through said sinuous wire structure produces heat in said thermally conductive adhesive to act on said thermally conductive adhesive.

10. The assembly of claim 9 wherein said support base is a printed circuit board and said electrically conductive sinuous wire structure has first and second ends and said first and second ends of said sinuous wire structure are respectively attached to first and second pads on said printed circuit board and said first and second pads are connected to supply electric current to said sinuous wire structure.

11. The assembly of claim 10 wherein said sinuous wire structure is made of a metal alloy containing nickel and chromium.

12. The assembly of claim 10 wherein said sinuous wire structure is insulated from said suface and said package by dielectric insulation on said wire.

13. The assembly of claim 12 wherein said sinuous wire structure is made of a metal alloy containing nickel and chromium.

14. The method of attaching a package to a support base comprising the steps of:
   forming a resistive electrically conductive wire into a sinuous wire structure intermediate the ends thereof;
   placing the sinuous wire structure on the surface of a support base;
   placing adhesive over the support base;

placing a package over the adhesive and sinuous wire structure, the sinuous wire structure being configured so that it does not cross itself between the package and the surface of the support base so that the wire serves as a spacer to space the package above the surface of the support base;

pressing down the package so that the space between the package and support base defined by the sinuous wire structure is substantially filled with adhesive; and causing the adhesive to set to attach adhesively the package to the support base.

15. The method of attaching a package to a support base comprising the steps of:

forming a resistive electrically conductive wire into a sinuous wire structure intermediate the ends thereof;

placing the sinuous wire structure on the surface of a support base;

placing adhesive over the support base;

placing a package over the adhesive and sinuous wire structure, the sinuous wire structure being configured so that it does not cross itself between the package and the surface of the support base so that the wire serves as a spacer to space the package above the surface of the support base;

pressing down the package so that the space between the package and support base defined by the sinuous wire structure is substantially filled with adhesive;

causing the adhesive to set to attach adhesively the package to the support base; and removing the package from the support base by softening the adhesive by passing current through the sinuous wire structure to release the adhesive attachment of the package on the support base by softening the adhesive.

16. The method of atttaching a package to a support base comprising the steps of:

forming a resistive electrically conductive wire into a sinuous wire structure intermediate the ends thereof;

placing the sinuous wire structure on the surface of a support base;

placing adhesive over the support base;

placing a package over the adhesive and sinuous wire structure, the sinuous wire structure being configured so that it does not cross itself between the package and the surface of the support base so that the wire serves as a spacer to space the package above the surface of the support base;

pressing down the package so that the space between the package and support base defined by the sinuous wire structure is substantially filled with adhesive;

causing the adhesive to set to attach adhesively the package to the support base; and attaching the ends of the sinuous wire structure to separate pads on a printed circuit board so that current may be passed through the sinuous wire structure.

17. The method of claim 16 further including the subsequent step of:

removing the package from the support base by softening the adhesive by passing current through the sinuous wire structure to release the adhesive attachment of the package on the support base by softening the adhesive.

18. The method of attaching a first member to a second member comprising the steps of:

forming a resistive electrically conductive wire into a sinuous wire structure intermediate the ends thereof;

placing the sinuous wire structure on the surface of the first member;

placing adhesive over the surface of the first member;

placing the second member over the adhesive and sinuous wire structure, the sinuous wire structure being configured so that it does not cross itself between the members so that the wire serves as a spacer to space the members;

pressing down the second member so that the space between the members defined by the sinuous wire structure is substantially filled with adhesive; and causing the adhesive to set to attach adhesively the members together.

19. The method of claim 18, further including the subsequent step of:

allowing the two members to separate by softening the adhesive by passing current through the sinuous wire structure to release the adhesive attachment of one member to the other by softening the adhesive.

* * * * *